United States Patent

Murakami et al.

[11] Patent Number: 6,033,929
[45] Date of Patent: Mar. 7, 2000

[54] METHOD FOR MAKING II-VI GROUP COMPOUND SEMICONDUCTOR DEVICE

[75] Inventors: Masanori Murakami; Yasuo Koide, both of Kyoto; Nobuaki Teraguchi, Nara, all of Japan

[73] Assignee: Sharp Kabushiki Kaisha, Osaka, Japan

[21] Appl. No.: 08/620,275

[22] Filed: Mar. 22, 1996

[30] Foreign Application Priority Data

Mar. 24, 1995 [JP] Japan .................................. 7-066373

[51] Int. Cl.[7] .................................................. H01L 21/00
[52] U.S. Cl. .......................... 438/46; 438/37; 438/102; 438/571; 438/572; 438/573; 438/575; 438/603; 438/660; 438/663
[58] Field of Search ................................ 438/37, 46, 102, 438/571, 572, 573, 575, 603, 660, 663, 289

[56] References Cited

U.S. PATENT DOCUMENTS 3,780,427  12/1973  Jenkins et al. .
5,363,395  11/1994  Gaines et al. ............................. 372/45

FOREIGN PATENT DOCUMENTS 0632504   1/1995  European Pat. Off. .
WO 94/18709  8/1994  WIPO .

OTHER PUBLICATIONS

Fan et al., "Graded band gap ohmic contact to p–ZnSe" *Appl. Phys. Lett.* (1992) 61(26):3160–3162.

Hiei et al., "Ohmic contacts to p–type ZnSe Using ZnTe/ZnSe multiquantum wells" *Electronics Letters* (1993) 29(10):878–879.

Lim et al., "Highly conductive p–type ZnSe formation using Li3N diffusion" Extended abstracts of the 1994 International Conference on Solid State Devices and Materials, Yokohama, Japan (1994) pp. 967–968.

Haase et al., "Short wavelength II–VI laser diodes" Inst. Phys. Conf. Ser. No. 120, Chapter 1, pp. 9–16.

Ohtsuka et al., "Growth and characterization of p–type CdSe" *Extended Abstracts (54th) Japan Soc. of Appl. Phys.* p. 255.

Cordes, H., et al., "Electrical properties and contact metallurgy of elemental (Cu, Ag, Au, Ni) and compound contacts on p–$Cd_{0.95}Zn_{0.05}Te$" *Semiconductor Science and Technology* (1995) 10(1):77–86.

Japanese publication 05–259509, published Oct. 8, 1993. (abstract only).

Zozime, A., et al., "Properties of sputtered mercury telluride contacts on p–type cadmium telluride" *Revue Phys. Appl.* (1988) 23: 1825–1835.

*Primary Examiner*—Wael Fahmy
*Assistant Examiner*—Long Pham
*Attorney, Agent, or Firm*—Morrison & Foerster, LLP

[57] ABSTRACT

A II-VI group compound semiconductor device includes a semiconductor substrate, a $Zn_XMg_{1-X}S_YSe_{1-Y}$ ($0 \leq X \leq 1$, $0 \leq Y \leq 1$) semiconductor layer formed on the semiconductor substrate, and an electrode layer formed on the semiconductor layer, the electrode layer containing an additive element of Cd or Te and a metal which can form a eutectic alloy with the additive element, thus achieving an electrode layer having a small contact resistance, especially an electrode layer with an ohmic contact.

10 Claims, 7 Drawing Sheets

Intermediate layer is not formed

Fig. 9a

Intermediate layer having uniform concentration $\Phi_B = \Phi_{B1} - \Phi_{B2}$

Fig. 9b

Intermediate layer having graded concentration $\Phi_{B2} = 0$ $\Phi_B > \Phi_{B1}$

METHOD FOR MAKING II-VI GROUP COMPOUND SEMICONDUCTOR DEVICE

BACKGROUND OF THE INVENTION

1. Field of the Invention

The present invention relates to a II-VI group compound semiconductor device, and a method for manufacturing the same. More particularly, it relates to a II-VI group compound semiconductor device having an electrode structure which shows small contact resistance, and a method for manufacturing the same. Especially, it relates to a II-VI group compound semiconductor device having an electrode layer which enables an ohmic contact between an electrode and a semiconductor layer, and a method for manufacturing the same.

2. Description of the Related Arts

So far, various types of electrode structures for a II-VI group compound semiconductor device have been studied. Haase et al., for example, have examined the applicability of Li, Na, Mg, Ti, Cr, Mn, Ni, Pd, Pt, Cu, Ag, Zn, Hg, Al, In, Sn, Pb, Sb, or Bi and alloys thereof as electrode materials ("Short wavelength II-VI laser diodes", Inst. Phys. Conf. Ser. No.120 P.9). However, electrode materials which provide an ohmic contact for II-VI group compound semiconductors have not yet been found.

Thus, Au is extensively used as an electrode metal, but Au does not form an ohmic contact, because it rather forms a Schottky junction with approximately 1.2 eV of potential barrier to p-type ZnSe.

In order to provide an ohmic contact to, for example, p-type ZnSe, methods such as the following are considered: a low contact-energy barrier intermediate layer of CdSe or HgSe is epitaxially grown between the electrode and the p-type ZnSe; or p-type ZnTe is used for a contact layer, and an intermediate layer of a p-type ZnSeTe graded composition layer or a p-type ZnSe/ZnTe strained-layer superlattice is used between the p-type ZnSe and p-type ZnTe. Ohtsuka et al. have demonstrated an ohmic contact of Au/p-CdSe and reported the possibility of an ohmic contact of Au/p-CdSe/p-ZnSe ("Growth and characterization of p-type CdSe", Ohtsuka et al., Extended Abstracts (the 54th) p.255, The Japan Society of Applied Physics). Lansari et al. have made a good ohmic contact by growing HgSe on the p-type ZnSe as a low contact-energy barrier intermediate layer by MBE method and using Au as an electrode metal ("Improved ohmic contact for p-type ZnSe and related p-on-n diode", Y. Lansari et al., Appl. Phys. Lett. 61 p.2554). Fan et al. ("Graded bandgap ohmic contact to p-ZnSe", Y. Fan et al., Appl. Phys. Lett. 61 p.3160), and Hiei et al. ("Ohmic contact to p-type ZnSe using ZnTe/ZnSe multiquantum wells", F. Hiei et al., Electronics Lett. 29 p.878) have reported the fabrication of an ohmic contact by using p-type ZnTe for the contact layer and using an intermediate layer of a p-type ZnSeTe graded composition layer or a p-type ZnSe/ZnTe strained-layer superlattice between the p-type ZnSe and p-type ZnTe.

Further, Lim et al. have made an ohmic contact by diffusing $Li_3N$ ("Highly conductive p-type ZnSe formation using $Li_3N$ diffusion", S. W. Lim et al., Extended Abstracts of SSDM, 1994 p.967).

However, none of the methods of making ohmic contacts to the conventional II-VI group compound semiconductors are satisfactory enough. For example, they have problems such as the following.

When CdSe is used, a low acceptor concentration of $1 \times 10^{17}$ cm$^{-3}$ in CdSe makes it difficult to lower the contact resistance. When HgSe is used, the sharing of the MBE apparatus, for example, used for forming other layers brings deteriorated properties of devices because of the mixing of Hg atoms into other layers. Introducing an exclusive MBE apparatus to grow HgSe leads to lower productivity. Furthermore, HgSe has poor chemical and physical stability.

When ZnTe is used, the stress remaining in the film because of a large lattice mismatch between ZnSe and ZnTe may deteriorate the properties of the devices, and it is difficult to optimize ZnTe carrier concentration. A large lattice mismatch between ZnSe and any of the above intermediate layers also causes strain, and the epitaxial growth lowers the productivity.

When $Li_3N$ is diffused, diffusion temperature is as high as 470° C., so that, when this method is applied to the device structure, it may deteriorate the device properties and, since Li atoms are extremely liable to diffuse, it causes deterioration of the device properties in the course of time.

Furthermore, the Au electrode used in the above methods is inferior in mechanical strength such as adhesion.

Accordingly, research was continued to create a new electrode structure which makes an ohmic contact to II-VI group compound semiconductors, especially to p-type $Zn_XMg_{1-X}S_YSe_{1-Y}$ ($0 \leq X \leq 1$, $0 \leq Y \leq 1$) semiconductors.

Figure 7:
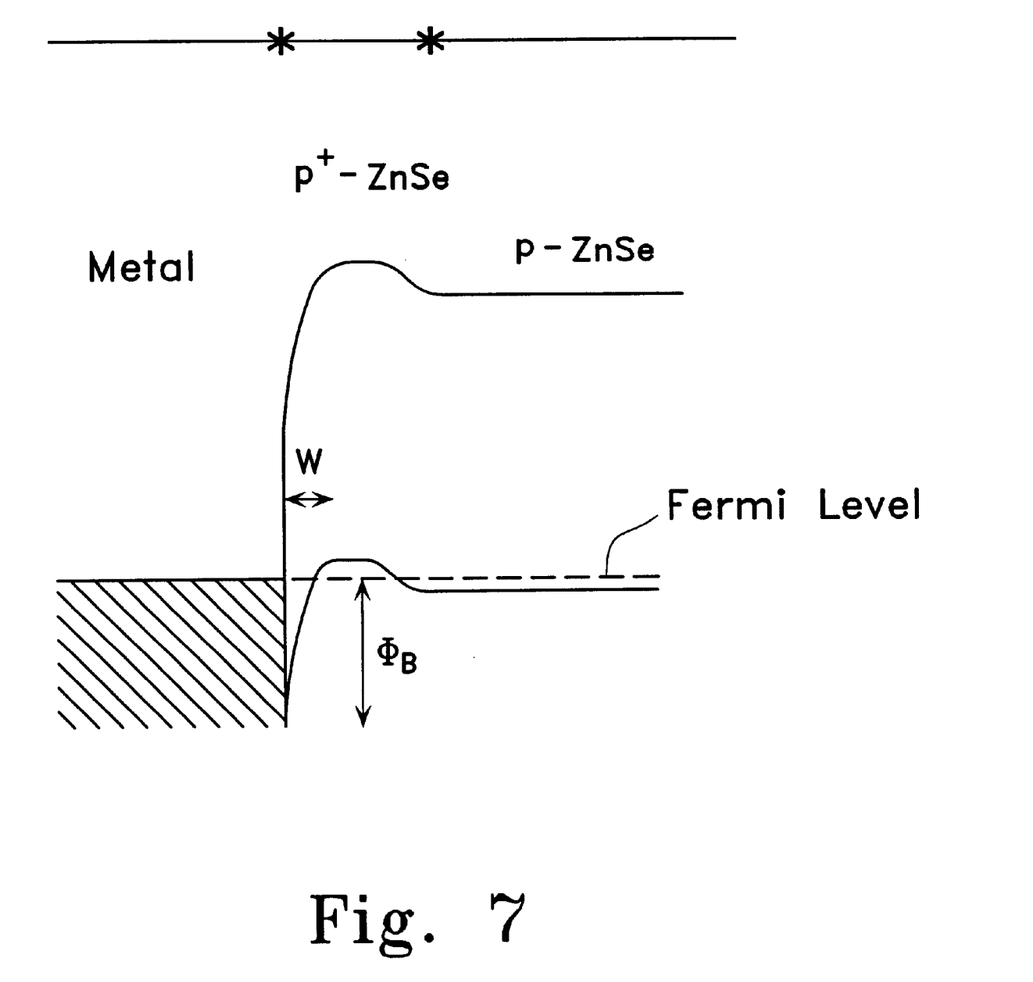
FIG. 7 is a band diagram illustrating the width of the Schottky barrier on the contact interface of a conventional metal and a p-type ZnSe.
Figure 8:
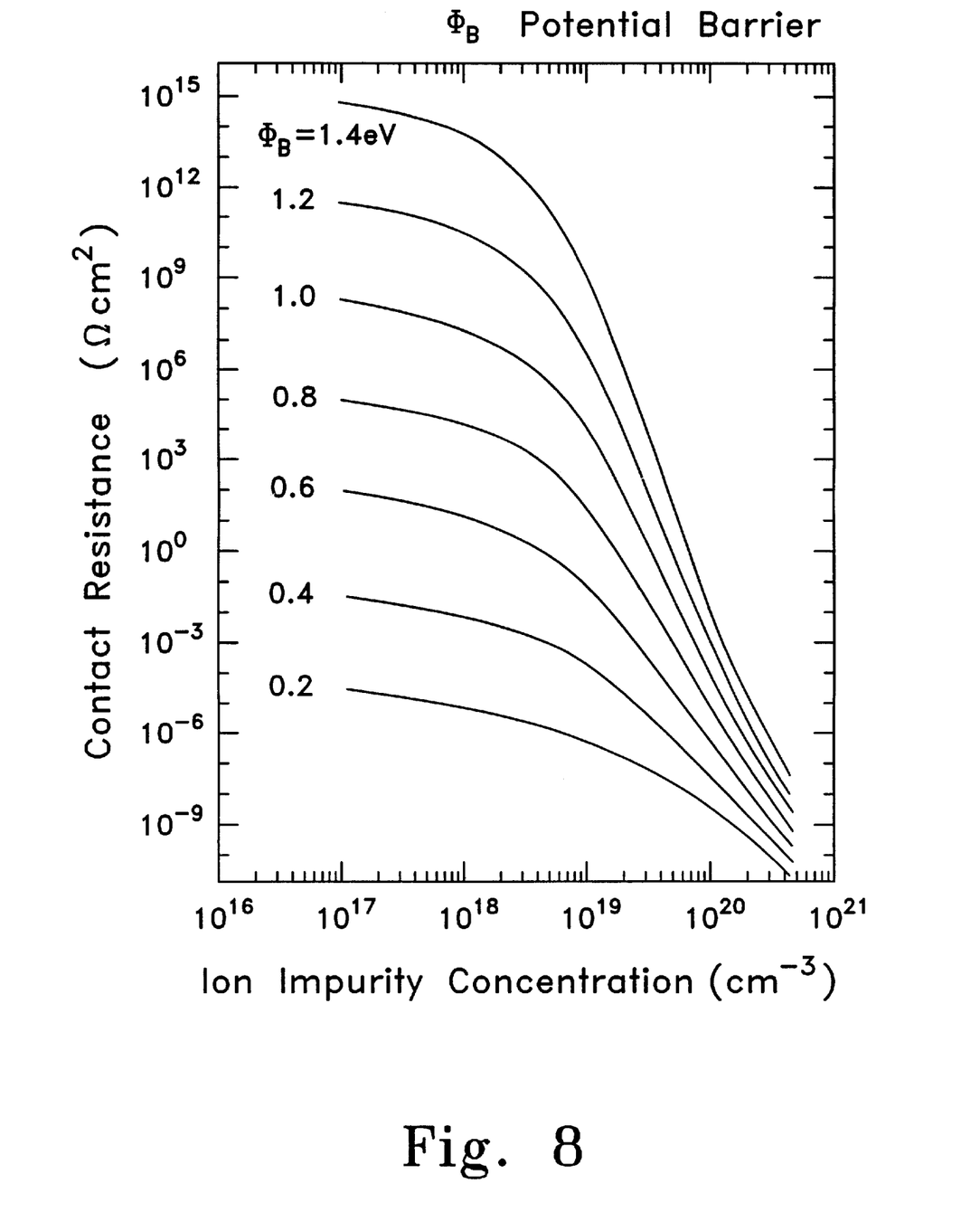
FIG. 8 is a graph illustrating how the contact resistance in a Schottky junction of a p-type ZnSe and a metal depends on ionized impurity concentration, which has been theoretically calculated based on a model considering the thermoemission tunneling current.
Figure 10:
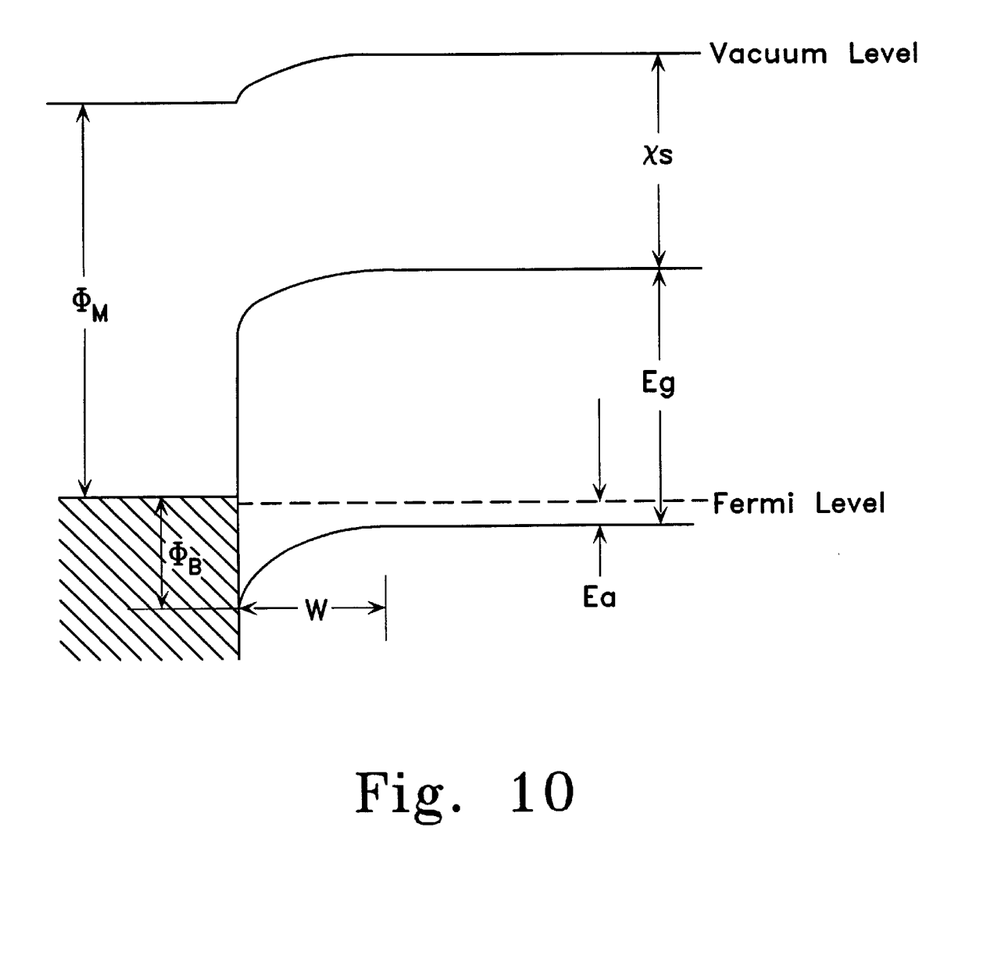
FIG. 10 is a band diagram showing the relationship.

FIG. 8 shows how the contact resistance of a metal/p-ZnSe Schottky junction depends on ionized impurity concentration with the potential barrier $\phi_B$ between the metal and the p-type ZnSe as a parameter. FIG. 7 is a band diagram illustrating the Schottky barrier width (W) at the contact interface of the metal and the p-type ZnSe. $\phi_B$ is given by the formula: $\phi_B = \chi_s + E_g - \phi_M$, in which $\chi_s$ represents an electron affinity of semiconductor, $E_g$ represents a bandgap of semiconductor and $\phi_M$ represents a work function of metal. FIG. 10 shows these relationships. FIG. 8 shows what is obtained by a calculation using Yu's model in which the thermoemission tunneling current is considered ("Electron Tunneling and Contact Resistance of Metal-Si Contact Barrier", A. Y. C. Yu, Solid State Electronics Vol.13, p.239 (1970)). As a result, it is found that the contact resistance decreases with increase of the ionized impurity concentration. This is due to the decrease in Schottky barrier width (W) shown in FIG. 7 with increasing ionized impurity concentration, which results in rapid increase of the tunneling current.

This is also the same in the case of a metal/p-type $Zn_XMg_{1-X}S_YSe_{1-Y}$ ($0 \leq X \leq 1$, $0 \leq Y \leq 1$) interface, a metal/intermediate layer interface or an intermediate layer/p-type $Zn_XMg_{1-X}S_YSe_{1-Y}$ ($0 \leq X \leq 1$, $0 \leq Y \leq 1$) interface. For example, drawing a figure corresponding to FIG. 8 shows a similar tendency in which the contact resistance differs by one figure against the same potential barrier parameter.

In other words, an ohmic contact can be obtained by using a intermediate layer having a high ionized impurity concentration on the p-type $Zn_XMg_{1-X}S_YSe_{1-Y}$ ($0 \leq X \leq 1$, $0 \leq Y \leq 1$) semiconductor layer surface, on which a metal electrode is then formed.

However, p-type $Zn_XMg_{1-X}S_YSe_{1-Y}$ ($0 \leq X \leq 1$, $0 \leq Y \leq 1$) semiconductor layer can be formed only by MBE method, and its ionized impurity concentration is, at best, in the order of $10^{17}$ cm$^{-3}$, so that it was impossible to form a layer with a high ionized impurity concentration sufficient to make an ohmic contact.

Further, in the Japanese Unexamined Patent Publication No. HEI 5(1993)-259509, the intermediate layer is restricted to ZnCdSe and ZnHgSe and, besides, the method of forming the intermediate layer includes depositing by MBE method, which causes low productivity.

SUMMARY OF THE INVENTION

The present invention provides a II-VI group compound semiconductor device comprising a semiconductor substrate, a $Zn_XMg_{1-X}S_YSe_{1-Y}$ ($0 \leq X \leq 1$, $0 \leq Y \leq 1$) semiconductor layer formed on the semiconductor substrate, and an electrode layer formed on the semiconductor layer, the electrode layer containing an additive element of Cd or Te and a metal which can form a eutectic alloy with the additive element.

The present invention also provides a II-VI group compound semiconductor device comprising a semiconductor substrate, a $Zn_XMg_{1-X}S_YSe_{1-Y}$ ($0 \leq X \leq 1$, $0 \leq Y \leq 1$) semiconductor layer formed on the semiconductor substrate, an intermediate layer formed on the semiconductor layer, and an electrode layer formed on the intermediate layer, the intermediate layer containing a compound of an element constituting the semiconductor layer and an additive element of Cd or Te, and the electrode layer containing a metal which can form a eutectic alloy with the additive element.

Accordingly, an object of the present invention is to provide a II-VI group compound semiconductor device and a method for manufacturing the same wherein electrodes with small contact resistance are available without directly forming a p-type $Zn_XMg_{1-X}S_YSe_{1-Y}$ ($0 \leq X \leq 1$, $0 \leq Y \leq 1$) semiconductor layer having a high ionized impurity concentration.

BRIEF DESCRIPTION OF THE DRAWINGS

$$\phi_B{}^X = {}_sE_g - \phi_M.$$

DETAILED DESCRIPTION OF THE PREFERRED EMBODIMENTS

The semiconductor substrate that can be used for the present invention is not specifically limited but may be, for example, a GaAs substrate. Also, the conductivity type of the semiconductor substrate to be used is not specifically limited, so that it may be either n-type or p-type.

Figure 5:
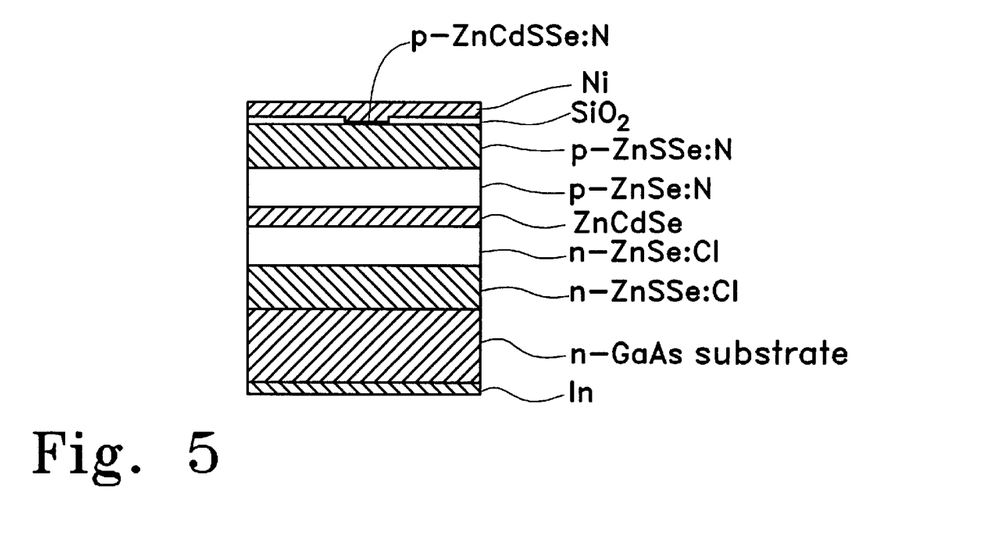
FIG. 5 is a schematic view showing an example of a II-VI group compound semiconductor device in accordance with the present invention.

The semiconductor device of the present invention is applicable as, for example, a light emitting diode or a semiconductor laser such as shown in FIG. 5. These devices comprise a semiconductor layer stacked on a substrate, in which the semiconductor layer comprises a p-type $Zn_XMg_{1-X}S_YSe_{1-Y}$ ($0 \leq X \leq 1$, $0 \leq Y \leq 1$) semiconductor layer. On the top surface of the semiconductor layer is formed an electrode layer which comprises:

(1) a structure having a component element consisting of Cd or Te and a metal that can form a eutectic alloy with the component element.

(2) a stacked-layer structure having (a) an intermediate layer comprising a compound of the element constituting the semiconductor layer and an additive element consisting of Cd or Te and (b) an electrode layer formed on the intermediate layer, the electrode layer comprising a metal that can form a eutectic alloy with the additive element.

The semiconductor layer may comprise one or more layers in a stack structure. For example, in the case of laser device, a specific but not limitative example of semiconductor layer according to the present invention is a stack structure comprising a ZnSSe buffer layer, a ZnMgSSe cladding layer, a ZnSSe optical waveguide layer, a ZnCdSe active layer, a ZnSSe optical waveguide layer, a ZnMgSSe cladding layer, and a ZnSe contact layer. Here, the conductivity type of the semiconductor layer to be used is not specifically limited, so that it may be either n-type or p-type.

Examples of the semiconductor layer in accordance with the present invention include ZnS (X=1, Y=1), MgS (X=0, Y=1), ZnSe (X=1, Y=0), MgSe (X=0, Y=0), $ZnS_YSe_{1-Y}$ (X=1, 0<Y<1), $MgS_YSe_{1-Y}$ (X=0, 0<Y<1), $Zn_XMg_{1-X}S$ (0<X<1, Y=1), $Zn_XMg_{1-X}Se$ (0<X<1, Y=0) or $Zn_XMg_{1-X}S_YSe_{1-Y}$ (0<X<1, 0<Y<1). Preferable examples of the semiconductor layer are ZnSe (most extensively used for contact layers), $ZnS_{0.07}Se_{0.93}$ (lattice-matched to GaAs), and ZnMgSSe (lattice-matched to GaAs and having less than 3.0 eV of bandgap energy and not less than $10^{17}$ cm$^{-3}$ of effective acceptor concentration Na—Nd). The thickness of the semiconductor layer is not specifically limited and may be suitably adjusted in accordance with, for example, the use of the semiconductor device.

The intermediate layer of the present invention comprises, for example, a compound of the elements constituting the semiconductor layer and Cd, a compound of the elements constituting the semiconductor layer and Te, a compound formed of the above two compounds, or a compound having three or more elements. Specific examples are ZnSCd, MgSeCd, ZnSSeCd, MgSSeCd, ZnMgSCd, ZnMgSeCd, ZnMgSSeCd, ZnSTe, MgSeTe, ZnSSeTe, MgSSeTe, ZnMgSTe, ZnMgSeTe, and ZnMgSSeTe.

The concentration of the additive element (Cd or Te) in the intermediate layer may be either uniform or distributed. Preferably, the concentration is higher on the electrode layer side than the semiconductor layer side. More preferably, the concentration decreases continuously from the electrode layer side to the semiconductor layer side, on which the concentration becomes 0%.

In order to decrease contact resistance, it is preferable that a p-type impurity (such as N, Li and the like) is added to the intermediate layer and that the concentration is as high as or higher than that of the p-type impurity in the semiconductor layer. The concentration, though depending on the kind of p-type impurities, is more than $1 \times 10^{18}$ cm$^{-3}$. As the p-type impurity concentration in the intermediate layer becomes higher, the contact resistance becomes lower as shown in FIG. 8, hence preferable. The energy barrier between the intermediate layer and semiconductor layer is preferably less than 0.6 eV, more preferably less than 0.4 eV at which the contact resistance decreases remarkably as shown in FIG. 8. In the case of Au/p-ZnSe, for example, it corresponds to the curve $\phi_B=1.2$ eV in FIG. 9. The contact resistance of the semiconductor device in accordance with the present invention can be reduced to approximately $10^{-14}$ times when compared with that of Au/p-ZnSe.

The electrode layer that can be used for the present invention may comprise an additive element contained in the intermediate layer and a metal that can form a eutectic alloy with the additive element. Also, the electrode layer may comprise the elements constituting the semiconductor layer, and contain an intermetallic compound (which is also a eutectic alloy) of these elements and a metal that can form a eutectic alloy with the additive element. Examples of a metal that can form a eutectic alloy with Cd are In, Bi, Sn, Pb, Zn, and Tl, while an example of a metal that can form a eutectic alloy with Te is Ag.

Therefore, specific examples of a eutectic alloy contained in the electrode layer are InCd, BiCd, SnCd, PbCd, ZnCd, TlCd, InZnTe, InSe, BiSe, SnSe, PbSe, ZnSe, InZn, BiZn, SnZn, PbZn, AgTe, ZnAg, and a combination thereof which is a poly-element-type intermetallic compound.

The eutectic point of the eutectic alloy is preferably less than the temperature such that the properties of the semiconductor device are not deteriorated. In other words, the eutectic point is preferably less than the growth temperature of the semiconductor layer. For example, it is especially preferable to have less than 450° C. if the semiconductor layer is grown by MOCVD method, and less than 300° C. if the semiconductor layer is grown by MBE method. Examples of the especially preferable eutectic alloy that satisfies these conditions include InCd (Cd composition 26% w/w, eutectic point 122° C.), BiCd (Cd composition 40% w/w, eutectic point 144° C.), SnCd (Cd composition 32% w/w, eutectic point 177° C.), PbCd (Cd composition 28% w/w, eutectic point 248° C.), ZnCd (Cd composition 73% w/w, eutectic point 266° C.), TlCd (Cd composition 17% w/w, eutectic point 204° C.), and AgTe (Te composition 70% w/w, eutectic point 353° C.).

The energy barrier between the intermediate layer and the electrode layer may be lower than that between the electrode layer and the semiconductor layer, preferably less than 0.4 eV. The energy barrier reduced to approximately 0.6 eV lowers contact resistance to approximately $10^{-10}$ times in comparison with Au/p-ZnSe. Further, the energy barrier reduced to less than 0.4 eV lowers contact resistance to not more than $10^{-14}$ times.

The present invention provides a method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate, forming an additive element layer of Cd or Te on the semiconductor layer, and forming, on the additive element layer, an electrode layer which can form a eutectic alloy with the additive element.

Alternatively, the present invention provides a method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate and sequentially forming, on the semiconductor layer, a lower electrode layer comprising a metal which can form a eutectic alloy with an additive element of Cd or Te, an additive element layer of Cd or Te, and an upper electrode layer comprising a metal which can form a eutectic alloy with the additive element of Cd or Te.

Furthermore, the present invention provides a method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate and forming a eutectic alloy layer containing Cd or Te on the semiconductor layer.

The semiconductor layer of the present invention is formed by being stacked once or several times by a known method using the desired additive elements. A known method is, for example, the MBE method. Since naturally oxidized and carbonized films are formed on the surface of the semiconductor layer with the passage of time, it is preferable to remove the oxidized and carbonized films before forming the intermediate layer and the electrode layer.

It is possible to stack the electrode layer and the lower and upper electrode layers by a known method using the desired additive elements. A known method is, for example, the electron beam evaporation method or the sputter method.

When the intermediate layer and the electrode layer are stacked by the above method, at the interfaces between the semiconductor layer and the electrode layer, and between the electrode layer and the intermediate layer are generally formed eutectic alloy layers of the elements constituting the two layers. Thermal treatment after stacking favorably broadens the area where the eutectic alloy layer of the elements is formed. The thermal treatment temperature, though depending on the elements used, is preferably in the range of 100° C. to 300° C. Here, the electric furnace annealing method or RTA (Rapid Thermal Annealing) method is available for use.

In any case, it is preferable to remove the oxides and carbides from the semiconductor layer surface before forming the electrode layer or the lower electrode layer.

Figure 9A:
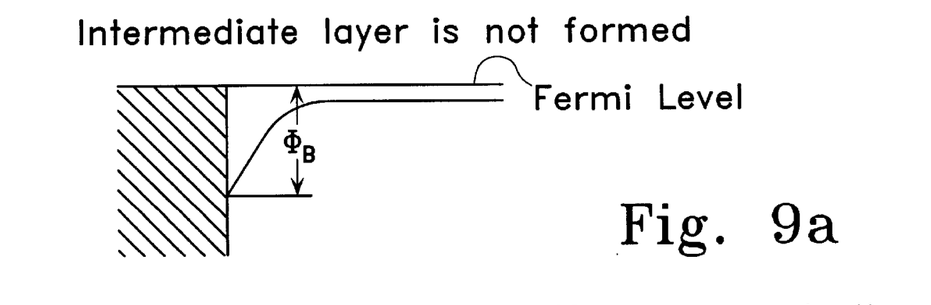
FIGS. 9(a) to (d) are band diagrams of the semiconductor device when an intermediate layer is formed in accordance with the present invention.
Figure 9B:
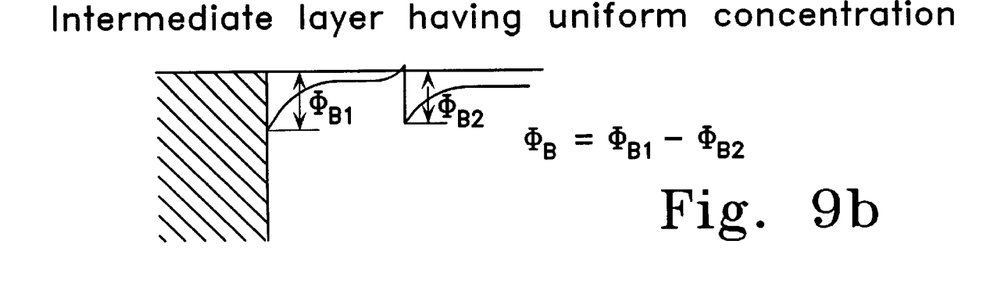
Figure 9C:
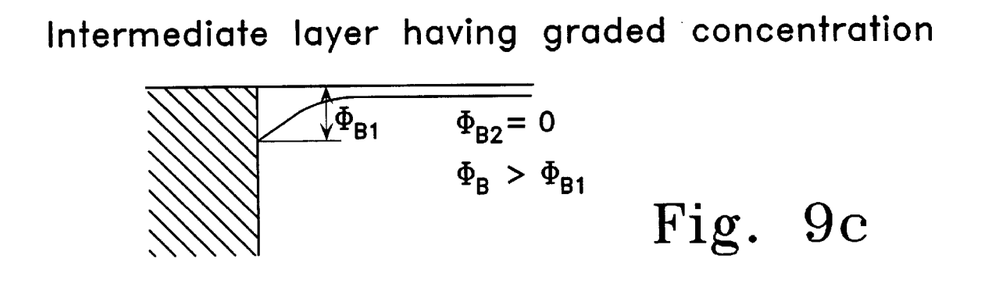

As shown in FIG. 9 in accordance with the present invention, by forming an intermediate layer in the first place, the potential barrier between a $Zn_XMg_{1-X}S_YSe_{1-Y}$ ($0 \leq X \leq 1$, $0 \leq Y \leq 1$) semiconductor layer and an electrode layer is divided into two parts between the $Zn_XMg_{1-X}S_YSe_{1-Y}$ ($0 \leq X \leq 1$, $0 \leq Y \leq 1$) semiconductor layer and the intermediate layer, and between the intermediate layer and the electrode layer (FIG. 9(b)). Since the contact resistance on the interface superlinearly decreases in response to the decrease of the potential barrier as illustrated in FIG. 8 and the potential barrier is divided into two, the whole contact resistance decreases remarkably and an ohmic contact is easier to make. FIG. 9(a) shows a band diagram in which the intermediate layer is not formed.

Figure 9D:
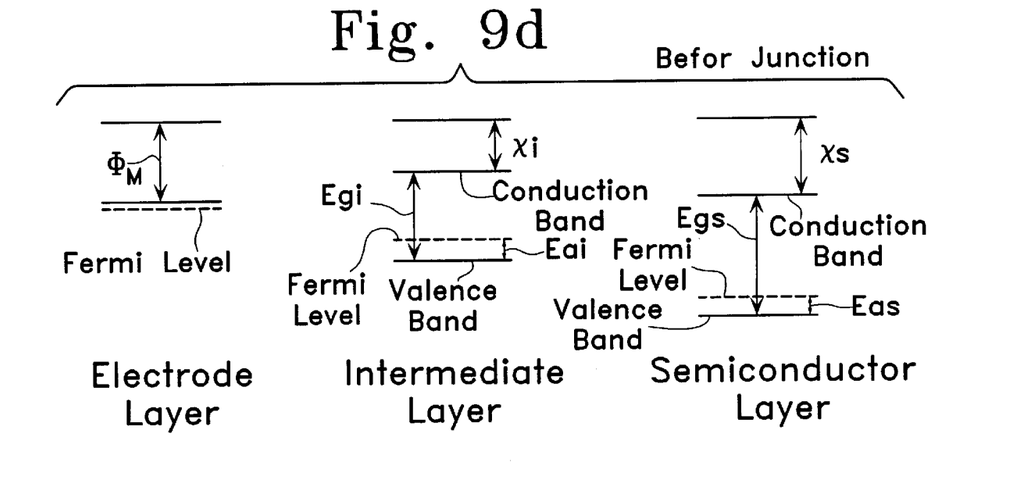

As shown in FIG. 9(d), which conceptually illustrates the state of each layer before forming junction, contact resistance is decreased because the top of a valence band of the intermediate layer in accordance with the present invention is positioned higher than that of the $Zn_XMg_{1-X}S_YSe_{1-Y}$ ($0 \leq X \leq 1$, $0 \leq Y \leq 1$) semiconductor layer, and positioned between the top of the valence band of the $Zn_XMg_{1-X}S_YSe_{1-Y}$ ($0 \leq X \leq 1$, $0 \leq Y \leq 1$) semiconductor layer and the Fermi level of the electrode layer.

More particularly, the semiconductor layer, the intermediate layer and the electrode layer in accordance with the present invention satisfy the relationship:

$$\phi_M < \chi_i + E_{gi} - E_{ai} < \chi_s + E_{gs} - E_{as},$$

in which $\phi_M$ represents a potential barrier of the electrode layer, $\chi i$ represents an electron affinity of the intermediate layer, Egi represents a bandgap of the intermediate layer, Eai represents an impurity level of the intermediate layer, s represents an electron affinity of the semiconductor layer, Egs represents a bandgap of the semiconductor layer and Eas represents an impurity level of the semiconductor layer.

Figure 6:
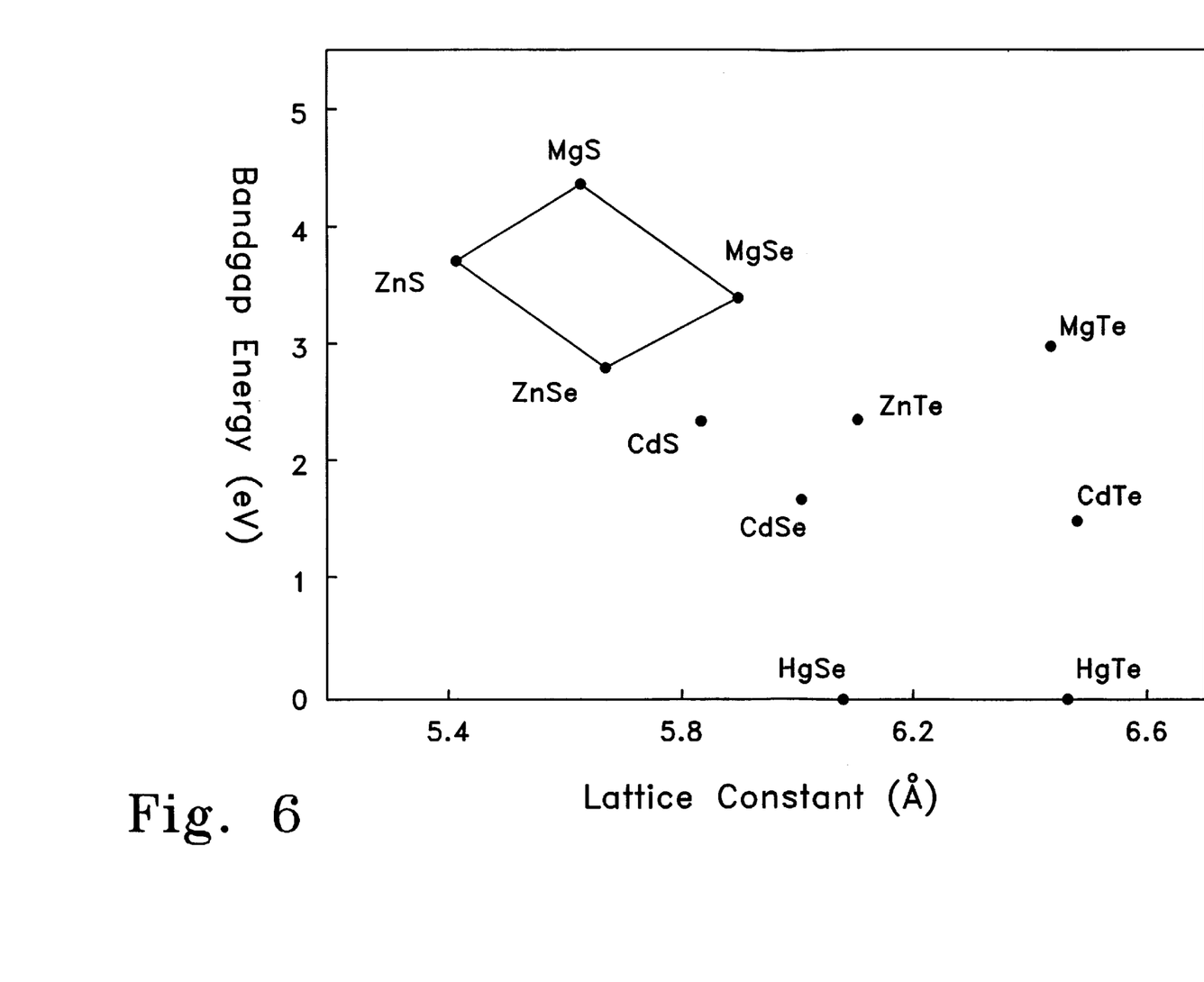
FIG. 6 shows relationship between the lattice constant and the bandgap of various II-VI group compound semiconductors.

Furthermore, in reference to the above, as shown in FIG. 6 illustrating the relationship between lattice constant and bandgap energy for each compound, the intermediate layer comprising a compound of the elements constituting the $Zn_XMg_{1-X}S_YSe_{1-Y}$ ($0 \leq X \leq 1$, $0 \leq Y \leq 1$) semiconductor layer and Cd or Te is a $Zn_aMg_bCd_{1-a-b}S_cSe_{1-c}$ ($0 \leq a, b, c \leq 1$, $a+b \leq 1$) semiconductor layer or a $Zn_dMg_{1-d}S_eSe_fTe_{1-e-f}$ ($0 \leq d, e, f \leq 1$, $e+f \leq 1$) semiconductor layer, each of which has a smaller bandgap than the $Zn_XMg_{1-X}S_YSe_{1-Y}$ ($0 \leq X \leq 1$, $0 \leq Y \leq 1$) semiconductor layer.

Since a semiconductor with a small bandgap has a lower impurity level Ea than one with a large bandgap, the impurity level of the intermediate layer is lower than that of the $Zn_XMg_{1-X}S_YSe_{1-Y}$ ($0 \leq X \leq 1$, $0 \leq Y \leq 1$) semiconductor layer. In other words, impurities are easier to activate in the intermediate layer than in the semiconductor layer, the ionized impurity concentration in the intermediate layer is easy to increase and the contact resistance between the intermediate layer and the electrode layer becomes very low as shown in FIG. 8.

Furthermore, the bandgap of the intermediate layer being smaller than that of the semiconductor layer makes the potential barrier smaller and decreases the contact resistance between the electrode layer and the intermediate layer.

When Cd is used for an additive element, according to the anion common rule, the valence band discontinuity between the intermediate layer and the $Zn_XMg_{1-X}S_YSe_{1-Y}$ ($0 \leq X \leq 1$, $0 \leq Y \leq 1$) semiconductor layer, that is, the potential barrier, becomes approximately zero. Thus, as shown in FIG. 8, the contact resistance between the intermediate layer and the semiconductor layer is less than $10^{-6} \Omega cm^2$, which decreases the contact resistance and helps to make an ohmic contact.

When Te is used for an additive element, the top of valence band of the intermediate layer rises more than that of the $Zn_XMg_{1-X}S_YSe_{1-Y}$ ($0 \leq X \leq 1$, $0 \leq Y \leq 1$) semiconductor layer, the potential barrier between the electrode layer and the intermediate layer becomes smaller and the contact resistance between the electrode layer and the intermediate layer lowers advantageously.

The effect of the above additive elements does not decrease even if the elements are mixed with each other.

Since ionized impurity concentration can be made higher in the intermediate layer than in the semiconductor layer, it is more advantageous to have a potential barrier between the electrode layer and the intermediate layer. Accordingly, it is preferable that additive element concentration is higher on the electrode layer side. Due to the same reason, the energy barrier between the intermediate layer and the electrode layer may be smaller than that between the electrode layer and the semiconductor layer, and it is possible to decrease contact resistance efficiently.

Furthermore, when the additive element concentration in the intermediate layer is graded so that it is high on the electrode layer side, not only is the potential barrier corresponding to the difference in concentration between both intermediate layer interfaces absorbed into the intermediate layer, but also it is possible to keep small the potential barrier on the interface between the intermediate layer and the semiconductor layer because of a lack of rapid compositional change from the intermediate layer to the semiconductor layer. In addition, by continuously lowering the additive element concentration in the intermediate layer from the electrode layer side to the semiconductor layer side on which it becomes zero, the potential barrier between the intermediate layer and the $Zn_XMg_{1-X}S_YSe_{1-Y}$ ($0 \leq X \leq 1$, $0 \leq Y \leq 1$) semiconductor layer becomes zero, and an ohmic contact is easier to make than when the additive element concentration is uniform in the intermediate layer (FIG. 9(c)).

On the other hand, when the concentration grades lower on the electrode layer side, each of the potential barriers divided into two enlarges more than when the concentration is uniform and this is undesirable for obtaining low contact resistance.

When an additive element is added at a high concentration, lattice strains based on the difference from the semiconductor layer in properties (lattice constant, thermal expansion coefficient) and crystal defects result, leading to deteriorated electrode characteristics. However, it is possible to lessen this effect of deterioration by letting the additive element concentration higher on the electrode layer side of the intermediate layer than on the semiconductor layer side.

When the electrode layer contains a metal that can form a eutectic alloy with Cd or Te, the elements contained commonly in the electrode layer and the intermediate layer form bondings such as In—Cd—Se on the interface between the electrode layer and the intermediate layer. This is desirable for making an ohmic contact because an insulation layer such as an oxide layer which intercepts electric current is not formed between the electrode layer and the intermediate layer.

Elements contained commonly in the electrode layer and the intermediate layer form bondings such as In—Cd—Se or In—Zn—Se on the interface between the electrode layer and the intermediate layer, providing excellent mechanical strength such as adhesion.

Better ohmic characteristics are further obtained if the metal that can form a eutectic alloy is selected from the group consisting of In, Bi, Sn, Pb, Zn, Tl and Ag.

In accordance with the method for manufacturing the semiconductor device of the present invention, it can form, between the electrode layer and the semiconductor layer, an intermediate layer comprising a compound of $Zn_XMg_{1-X}S_YSe_{1-Y}$ ($0 \leq X \leq 1$, $0 \leq Y \leq 1$) and Cd or Te, providing electrode structures excellent in mechanical strength such as adhesion because common elements are contained in the electrode layer and the intermediate layer, and in the intermediate layer and the semiconductor layer.

When an intermediate layer comprising Cd or Te is inserted between the upper and lower electrode layers comprising a metal that can form a eutectic alloy with Cd or Te, by the reaction of these electrode layers and the intermediate layer during the forming process or by annealing treatment, Cd or Te diffuses into the $Zn_XMg_{1-X}S_YSe_{1-Y}$ ($0 \leq X \leq 1$, $0 \leq Y \leq 1$) semiconductor layer, so that a compound of the $Zn_XMg_{1-X}S_YSe_{1-Y}$ ($0 \leq X \leq 1$, $0 \leq Y \leq 1$) semiconductor and Cd or Te is formed.

When a eutectic alloy comprising Cd or Te is formed on the $Zn_XMg_{1-X}S_YSe_{1-Y}$ ($0 \leq X \leq 1$, $0 \leq Y \leq 1$) semiconductor layer, by the reaction during the deposition or by annealing treatment, Cd or Te contained in the above eutectic alloy diffuses into the $Zn_XMg_{1-X}S_YSe_{1-Y}$ ($0 \leq X \leq 1$, $0 \leq Y \leq 1$) semiconductor layer and a mixed crystal is formed with the $Zn_XMg_{1-X}S_YSe_{1-Y}$ ($0 \leq X \leq 1$, $0 \leq Y \leq 1$). Here, as the eutectic point of the eutectic alloy decreases, the mixed crystal of the $Zn_XMg_{1-X}S_YSe_{1-Y}$ ($0 \leq X \leq 1$, $0 \leq Y \leq 1$) semiconductor layer and Cd or Te is formed at a lower annealing temperature.

When the surface of the $Zn_XMg_{1-X}S_YSe_{1-Y}$ ($0 \leq X \leq 1$, $0 \leq Y \leq 1$) semiconductor layer is cleaned in the process, good ohmic characteristics are obtained with favorable reproducibility. A chemical etching with an etching solution containing a saturated bromine water(SBW), for example, removes native oxides and carbides formed on the surface of the $Zn_XMg_{1-X}S_YSe_{1-Y}$ ($0 \leq X \leq 1$, $0 \leq Y \leq 1$), thereby forming a clean surface, and enables the steady manufacture of the electrode structure having the characteristics of the present invention. If the manufacturing process of the electrode structure follows immediately after the growth of the semiconductor layer (in-situ process), the cleaning step is omissible.

EXAMPLES

Example 1

Figure 1:
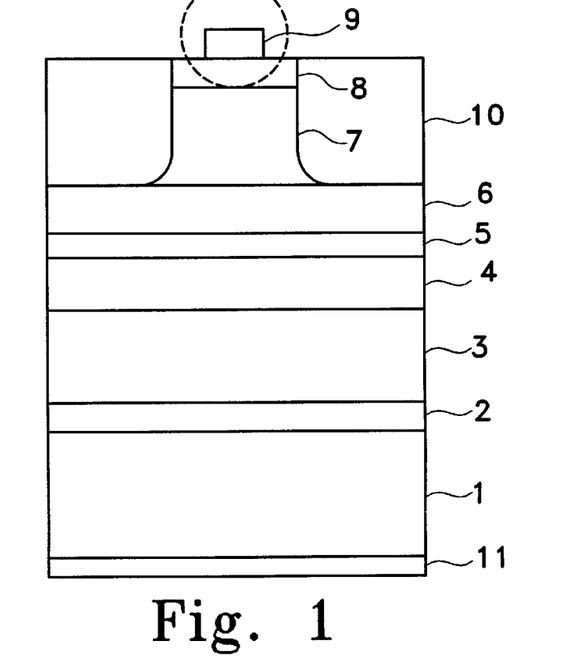
FIG. 1 is a schematic sectional view showing an embodiment of a II-VI group compound semiconductor device in accordance with the present invention.

FIG. 1 shows an II-VI group compound semiconductor device (semiconductor laser) using an ohmic contact structure of the present invention. The semiconductor laser structure comprises, on an n-type GaAs substrate 1, an n-type $ZnS_{0.07}Se_{0.93}$ buffer layer 2 (0.1 $\mu$m of film thickness, Nd—Na=$1 \times 10^{18}$ cm$^{-3}$), an n-type $Zn_{0.91}Mg_{0.09}S_{0.12}Se_{0.88}$ cladding layer 3 (1.0 $\mu$m of film thickness, Nd—Na=$5 \times 10^{17}$ cm$^{-3}$), an n-type $ZnS_{0.07}Se_{0.93}$ optical waveguide layer 4 (0.1 $\mu$m of film thickness, Nd—Na=$5 \times 10^{17}$ cm$^{-3}$), a $Zn_{0.8}Cd_{0.2}Se$ active layer 5 (75 Å of film thickness), a p-type $ZnS_{0.07}Se_{0.93}$ optical waveguide layer 6 (0.1 $\mu$m of film thickness, Na—Nd=$5 \times 10^{17}$ cm$^{-3}$), a p-type $Zn_{0.91}Mg_{0.09}S_{0.12}Se_{0.88}$ cladding layer 7 (1.5 $\mu$m of film thickness, Na—Nd=$5 \times 10^{17}$ cm$^{-3}$), a p-type ZnSe contact layer 8 (0.1 $\mu$m of film thickness, Na—Nd=$2 \times 10^{18}$ cm$^{-3}$), a p-type contact layer side electrode 9, an n-type semiconductor substrate side electrode 11 and a polyimide buried layer 10. The layers from the buffer layer 2 to the contact layer 8 were formed by MBE method.

Figure 2:
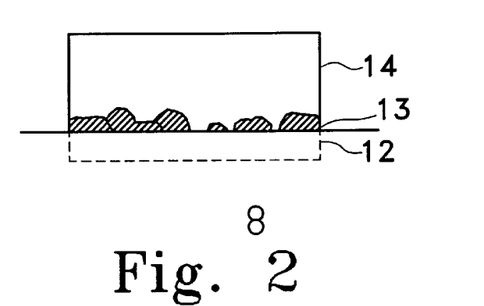
FIG. 2 is a schematic enlarged view of a p-type electrode of FIG. 1.

FIG. 2 shows an enlarged view of the p-type side electrode 9. In the p-type ZnSe contact layer 8 is formed a ZnCdSe layer 12, on which is formed an electrode layer 14 comprising CdBi (Cd: 60% w/w) and W.

Figure 3:
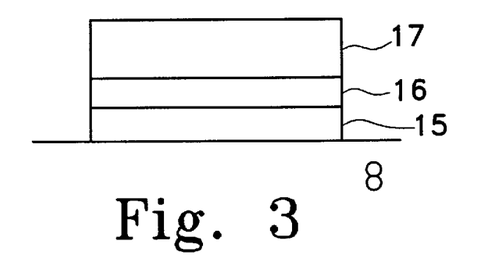
FIG. 3 is a view illustrating a deposition sequence for manufacturing an electrode of FIG. 2.

The electrode 9 was formed by depositing, on the p-type ZnSe contact layer 8, a Cd layer 15 with a thickness of 21 nm and then a Bi layer 16 with a thickness of 29 nm by resistive heating evaporation at room temperature. Further, with the substrate temperature maintained at room temperature, a W layer 17 was deposited with a thickness of 20 nm by electron beam evaporation (See FIG. 3). This was followed by 5 minutes of thermal treatment at 250° C. with an electric furnace. The Cd and Bi layers were formed by precisely weighing Cd and Bi so as to have a eutectic composition (Cd: 60% w/w) and by conducting successive vacuum evaporation with use of separate W boats. Incidentally, the same characteristics as above were obtained when a single W boat was used and the vacuum evaporation was conducted simultaneously. This is because the involved vapor pressure lets the Cd layer and the Bi layer to be sequentially formed when vacuum evaporation of Cd and Bi is conducted simultaneously. The electron beam evaporation and the resistive heating evaporation were carried out at less than 3 to $5 \times 10^{-7}$ Torr of background pressure and at less than $5 \times 10^{-6}$ Torr of vacuum during the evaporation.

Though, in the example, Bi was used for the metal that can form a eutectic alloy, and Cd was used for the additive element, the materials are not limited to them but may be any metal or intermetallic compound that can form a eutectic alloy with Cd or Te. The sputter method as well as the evaporation method can be used to deposit the metal or intermetallic compound.

In addition to the electric furnace annealing in the example, RTA (Rapid Thermal Annealing) may be used for the thermal treatment process. The lower limit of the thermal treatment temperature is preferably higher than the eutectic point and the upper limit is preferably lower than the temperature that adversely affects the characteristics of the semiconductor device. It is especially preferable to have less than 450° C. if the layers have been grown by MOCVD method and less than 300° C. if the layers have been grown by MBE method. A temperature lower than the above lower limit does not lead to sufficient formation of the intermediate layer, and a temperature higher than the above upper limit makes the device properties deteriorate, hence not preferable.

Before depositing the electrode metals, the surface of the p-type ZnSe contact layer was cleaned by ultrasonic cleaning for 5 minutes in acetone and 2 minutes in ethanol, and etched for 3 minutes with SBW:HBr:$H_2O$=1:10:90 used as an etchant at room temperature. The oxides, carbides and the like on the surface of the p-type ZnSe contact layer were removed by the etching.

A laser device with 1 mm of cavity length was made from the laser structure in FIG. 1 (stripe width: 5 $\mu$m) by cleaving. The laser device was placed on a copper heat sink with junction-up configuration, and the current-optical output characteristics and current-voltage characteristics of the device by CW operation were measured at room temperature. The end of the laser device cavity had no coating and kept as-cleaved.

Figure 4:
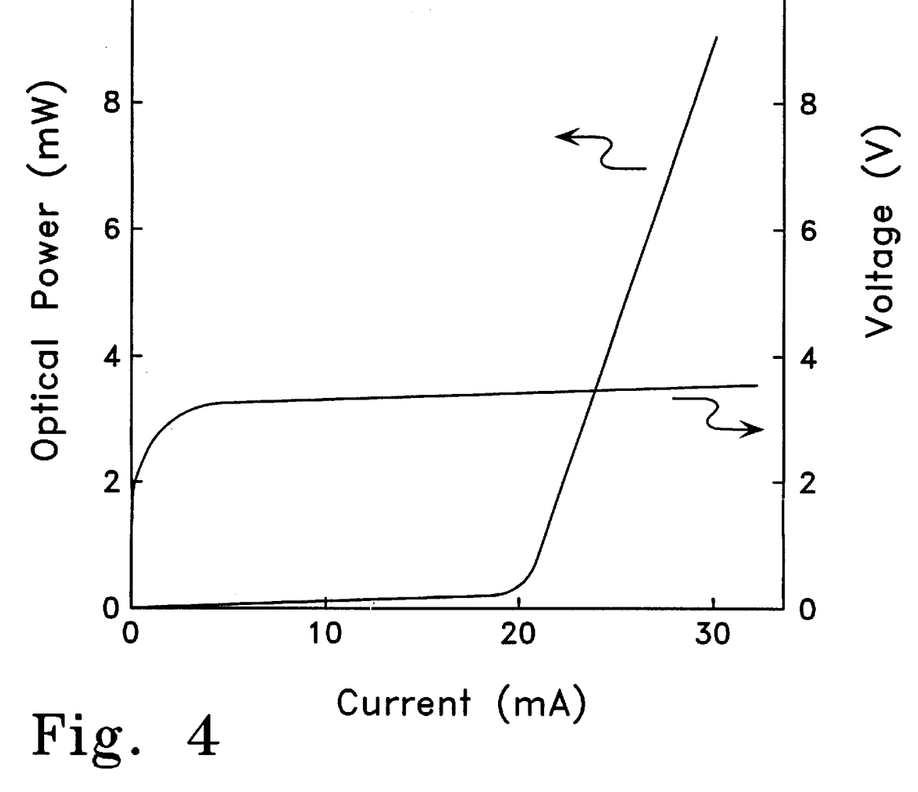
FIG. 4 is a graph illustrating current-optical output power characteristics and current-voltage characteristics of a laser device as an embodiment of the present invention.

FIG. 4 shows the current-optical output characteristics and current-voltage characteristics of the laser device. As shown in FIG. 4, 20 mA of lasing threshold current and 3.5 V of lasing threshold voltage of the device were obtained.

On the other hand, when the p-type side electrode 9 was formed of an Au electrode, the voltage was more than 10 V, and when the p-type side electrode 9 was formed of an Au/ZnTe/ZnSe-ZnTe electrode structure by Fan et al. ("Continuous-wave, room temperature, ridge waveguide green-blue diode laser", A. Salokatve et al., Electronics Lett. Vol.29 p.2192), it was 4.4 V.

Example 2

A semiconductor layer was formed in the same manner as in Example 1 except that the contact layer was a p-type $ZnS_{0.07}Se_{0.93}$ (0.1 $\mu$m of film thickness, Na—Nd=$1 \times 10^{18}$ cm$^{-3}$).

Then, a surface treatment was conducted in the same manner as in Example 1, followed by deposition of an In layer with a thickness of 20 nm and a Cd layer with a thickness of 20 nm by resistive heating evaporation at room temperature. Further, with the substrate temperature kept as it was, a W layer was deposited with a thickness of 20 nm by electron beam evaporation, followed by 5 minutes of heat treatment at 250° C. with an electric furnace to form a semiconductor laser.

The Cd and In layers were deposited by precisely weighing Cd and In so as to have a eutectic composition (Cd: 26% w/w) and by conducting successive vacuum evaporation with use of separate W boats.

Example 3

A semiconductor layer was formed in the same manner as in Example 1 except that a p-type $Zn_{0.91}Mg_{0.09}S_{0.12}Se_{0.88}$ cladding layer was used as the contact layer.

Then, a surface treatment was conducted in the same manner as in Example 1, followed by simultaneous deposition of Te and Ag layers by resistive heating evaporation at room temperature. Further, with the substrate temperature kept as it was, a W layer was deposited with a thickness of 20 nm by electron beam evaporation, followed by 5 minutes of heat treatment at 250° C. with an electric furnace to form a semiconductor laser.

The Te and Ag layers were deposited by precisely weighing Te and Ag so as to have a eutectic composition (Te: 70% w/w) and by conducting successive vacuum evaporation with use of separate W boats.

Investigations were conducted on also a case where an Ag layer with a thickness of 11 nm and a Te layer with a thickness of 55 nm were deposited by resistive heating evaporation at room temperature and, with the substrate temperature kept as it was, a W layer was deposited with a thickness of 20 nm by electron beam evaporation, and a case where a Te layer with a thickness of 55 nm and an Ag layer with a thickness of 11 nm were deposited by resistive heating evaporation at room temperature and, with the substrate temperature kept as it was, a W layer was deposited with a thickness of 20 nm by electron beam evaporation. As a result, semiconductor devices having characteristics similar to those of Example 1 were obtained.

According to the present invention, a blue-light emitting device with an operating voltage lower than that of the devices having conventional electrode structures is obtained with use of a II-VI group compound semiconductor device comprising a semiconductor substrate, a $Zn_XMg_{1-X}S_YSe_{1-Y}$ ($0 \leq X \leq 1$, $0 \leq Y \leq 1$) semiconductor layer formed on the semiconductor substrate, and an electrode layer formed on the semiconductor layer, the electrode layer containing an additive element of Cd or Te and a metal which can form a eutectic alloy with the additive element.

The above blue-light emitting device is also obtained with use of a II-VI group compound semiconductor device of the present invention comprising a semiconductor substrate, a $Zn_XMg_{1-X}S_YSe_{1-Y}$ ($0 \leq X \leq 1$, $0 \leq Y \leq 1$) semiconductor layer formed on the semiconductor substrate, an intermediate layer formed on the semiconductor layer, and an electrode layer formed on the intermediate layer, the intermediate layer comprising a compound of an element constituting the semiconductor layer and an additive element of Cd or Te, and the electrode layer containing a metal which can form a eutectic alloy with the additive element.

Further, in accordance with the method for manufacturing the semiconductor device of the present invention, an intermediate layer comprising compounds of a $Zn_XMg_{1-X}S_YSe_{1-Y}$ ($0 \leq X \leq 1$, $0 \leq Y \leq 1$) and Cd or Te is formed between the electrode layer and the semiconductor layer, thus providing electrode structures excellent in mechanical strength such as adhesion because common elements are contained in the electrode layer and the intermediate layer, and in the intermediate layer and the semiconductor layer.

What we claim is:

1. A method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate, forming an additive element layer of an additive element Cd or Te on the semiconductor layer, and forming, on the additive element layer, an electrode layer which can form a eutectic alloy with the additive element, wherein the semiconductor layer, the additive element layer and the electrode layer are thermally treated after the electrode layer is formed.

2. A method for manufacturing a II-VI group compound semiconductor device as set forth in claim 1, wherein W (tungsten) is deposited on the electrode layer which forms an eutectic alloy with the additive element.

3. A method for manufacturing a II-VI group compound semiconductor device as set forth in claim 1, wherein oxides and carbides on a surface of the $Zn_XMg_{1-X}S_YSe_{1-Y}$ ($0 \leq X \leq 1$, $0 \leq Y \leq 1$) semiconductor layer are removed before the additive element layer and the electrode layer are formed on the semiconductor layer.

4. A method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate and sequentially forming on the semiconductor layer:

a lower electrode layer which forms an eutectic alloy with an additive element of Cd or Te, an additive element layer of Cd or Te, and an upper electrode layer which forms an eutectic alloy with the additive element of Cd or Te.

5. A method for manufacturing a II-VI group compound semiconductor device as set forth in claim 4, wherein W (tungsten) is deposited on the electrode layer which forms an eutectic alloy with the additive element.

6. A method for manufacturing a II-VI group compound semiconductor device as set forth in claim 4, wherein oxides and carbides on the surface of the $Zn_XMg_{1-X}S_YSe_{1-Y}$ ($0 \leq X \leq 1$, $0 \leq Y \leq 1$) semiconductor layer are removed before the lower electrode layer, the additive element layer and the upper electrode layer are formed on the semiconductor layer.

7. A method for manufacturing a II-VI group compound semiconductor device as set forth in claim 4, wherein the semiconductor layer, the additive element layer and the electrode layer are thermally treated after the electrode layer is formed.

8. A method for manufacturing a II-VI group compound semiconductor device, comprising forming a $Zn_XMg_{1-X}S_YSe_{1-Y}$ ($0 \leq X \leq 1$, $0 \leq Y \leq 1$) semiconductor layer on a semiconductor substrate and forming a eutectic alloy layer containing Cd or Te on the semiconductor layer, wherein the semiconductor layer and the eutectic alloy layer are thermally treated after the eutectic alloy layer is formed.

9. A method for manufacturing a II-VI group compound semiconductor device as set forth in claim 8, wherein W (tungsten) is deposited on the eutectic alloy layer.

10. A method for manufacturing a II-VI group compound semiconductor device as set forth in claim 8, wherein oxides and carbides on the surface of the $Zn_XMg_{1-X}S_YSe_{1-Y}$ ($0 \leq X \leq 1$, $0 \leq Y \leq 1$) semiconductor layer are removed before the eutectic alloy layer containing Cd or Te is formed on the semiconductor layer.

* * * * *